US009261425B2

(12) United States Patent
Fahimi et al.

(10) Patent No.: US 9,261,425 B2
(45) Date of Patent: Feb. 16, 2016

(54) HIGH TEMPERATURE PRESSURE SENSOR

(71) Applicant: Rosemount Aerospace Inc., Burnsville, MN (US)

(72) Inventors: Saeed Fahimi, Bloomington, MN (US); Odd Harald Steen Eriksen, Minneapolis, MN (US); Charles Little, Burnsville, MN (US); Anita Fink, Burnsville, MN (US)

(73) Assignee: ROSEMOUNT AEROSPACE INC., Burnsville, MN (US)

( * ) Notice: Subject to any disclaimer, the term of this patent is extended or adjusted under 35 U.S.C. 154(b) by 160 days.

(21) Appl. No.: 14/192,952

(22) Filed: Feb. 28, 2014

(65) Prior Publication Data
US 2015/0185103 A1    Jul. 2, 2015

Related U.S. Application Data

(60) Provisional application No. 61/923,064, filed on Jan. 2, 2014.

(51) Int. Cl.
*G01L 19/04* (2006.01)
*G01L 19/06* (2006.01)
*G01L 19/00* (2006.01)

(52) U.S. Cl.
CPC ......... *G01L 19/0681* (2013.01); *G01L 19/0069* (2013.01); *G01L 19/0084* (2013.01); *B81B 2201/0264* (2013.01)

(58) Field of Classification Search
CPC ....... G01L 19/0681; G01L 19/04; G01L 7/00; G01L 19/0038; G01L 19/0645; E21B 21/08
USPC ........ 73/708, 700, 37, 152.22, 721, 715, 706, 73/720, 719, 717, 716
See application file for complete search history.

(56) References Cited

U.S. PATENT DOCUMENTS 4,970,898 A * 11/1990 Walish ................ G01L 19/0038
73/706
5,319,981 A *  6/1994 Mei ....................... G01L 13/025
338/4

(Continued)

FOREIGN PATENT DOCUMENTS

WO    WO-2008036705 A2    3/2008

OTHER PUBLICATIONS

Extended European Search Report dated Jun. 30, 2015, issued on corresponding European Patent Application No. 14199793.2.

*Primary Examiner* — Lisa Caputo
*Assistant Examiner* — Nigel Plumb
(74) *Attorney, Agent, or Firm* — Locke Lord LLP; Joshua L. Jones; Daniel J. Fiorello

(57) ABSTRACT

A pressure sensor assembly includes a pressure sensor having a pressure sensing transducer connected to a plurality of electrode pins via a plurality of electrode pads disposed on the transducer, an inner casing configured to hold the pressure sensing transducer including a plurality of inner casing electrode pin channels having the electrode pins disposed therein. The pressure sensor further includes an outer casing holding the inner casing therein having a capsule header with a plurality of capsule header electrode pin channels defined therein which can include a ceramic seal disposed therein such that the capsule header electrode pin channels engage the electrode pins in an insulating sealed relationship. The outer casing further includes an isolator plate including an isolator plate fluid port defined therein and a pressure isolator disposed on the isolator plate and configured to deflect in response to a change in ambient pressure. The pressure sensor includes a pressure transmitting fluid disposed in the fluid volume.

15 Claims, 2 Drawing Sheets

(56) References Cited

U.S. PATENT DOCUMENTS

| | | | | |
|---|---|---|---|---|
| 6,330,829 B1 * | 12/2001 | Kurtz | ................... | G01L 9/0055 73/717 |
| 6,938,490 B2 * | 9/2005 | Wagner | ................ | G01L 9/0042 73/708 |
| 7,921,721 B2 | 4/2011 | Kurtz | | |
| 8,191,425 B1 * | 6/2012 | Kurtz | ..................... | G01L 13/00 73/721 |
| 8,436,433 B1 * | 5/2013 | Isebrand | ............... | H01L 23/055 257/415 |
| 2010/0257937 A1 * | 10/2010 | Kurtz | ................. | G01L 19/0084 73/721 |

* cited by examiner

HIGH TEMPERATURE PRESSURE SENSOR

CROSS-REFERENCE TO RELATED APPLICATIONS

This application claims priority to U.S. Provisional Patent Application No. 61/923,064 filed Jan. 2, 2014, which is incorporated by reference herein in its entirety.

BACKGROUND

1. Field

The present disclosure relates to pressure sensing devices in the presence of high temperature, and more particularly to turbomachine pressure sensing devices.

2. Description of Related Art

Pressure sensors for turbomachines, aircraft, and/or other machines must be very robust due to the very harsh environments that the sensors must be exposed to in order to continue to produce meaningful readings. However, even the most robust of pressure sensors for turbines have limited upper temperature ranges that allow accurate pressure readings. Conventional pressure sensors only function up to maximum temperatures, which is a limitation on the use of such conventional pressure devices.

Such conventional methods and systems have generally been considered satisfactory for their intended purpose. However, there is still a need in the art for pressure sensing transducers having a high temperature range for accurate pressure readings. The present disclosure provides a solution for this problem.

SUMMARY

In at least one aspect of the present disclosure, a pressure sensor assembly includes a pressure sensor having a pressure sensing transducer connected to a plurality of electrode pins for transmitting an electrical signal, the pressure sensing transducer being connected to the electrode pins via a plurality of electrode pads disposed on the transducer by virtue of a plurality of wire bonds. The electrode pads can include zirconium, nickel, and/or gold and the electrode pins can have a diameter of about 0.010" to about 0.040". The electrode pins can include gold, gold plating, a noble metal, a noble metal plating, and/or any other suitable metal for wire bonding (e.g. Inconel 625).

In certain embodiments, an inner casing is configured to hold the pressure sensing transducer in a sensor pocket having a pocket volume larger than the sensor volume. The inner casing further includes a plurality of inner casing electrode pin channels having the electrode pins disposed therein. The inner casing electrode pin channels are defined in a first inner casing side and a fluid port is defined in a second inner casing side. The inner casing can include a high temperature plastic, any suitable material which is an insulator, or any other material with a thermal expansion coefficient such it does not interfere with the pressure sensor over range of temperatures.

An outer casing is configured to hold the inner casing therein and includes a capsule header having a plurality of capsule header electrode pin channels defined therein, wherein the capsule header receives the first inner casing side, the capsule header electrode pin channels including a ceramic seal (e.g. glass-ceramic seal or other high temperature insulating refractory or glassy material) disposed therein such that the capsule header electrode pin channels engage the electrode pins in an insulating sealed relationship. The outer casing can include a high temperature metal.

An isolator plate is disposed over the second inner casing side and in contact with the capsule header, the isolator plate including an isolator plate fluid port defined therein. The pressure sensor further includes a pressure isolator disposed on the isolator plate and configured to deflect in response to a change in ambient pressure. It is contemplated that the pressure isolator can be configured to have a neutral deflection at any suitable temperature that is midway between the highest and lowest operating temperatures for best performance of the sensor over the operating range (e.g. at about 75 degrees Celsius in some embodiments).

A fluid volume is defined by a total remaining space inside the inner casing and the outer casing combined that is not occupied by other solid components of the sensor. In some embodiments, the fluid volume can be nominally about 0.0004 cubic inches (or the smallest volume). In at least some embodiments, a pressure transmitting fluid (e.g. a petroleum oil or other high temperature/low vapor pressure fluid) is disposed in the fluid volume to transmit pressure from the pressure isolator to the pressure sensing transducer. The said fluid can have a maximum operating temperature of about 315 degrees Celsius before outgassing and causing embolisms in the diaphragm which degrades the accuracy of the sensor.

In some embodiments, the pressure sensor is a MEMS device. In some embodiments, the pressure sensor is free floating inside the inner casing and/or can consist of multiple silicon layers bonded by a high temperature frit (e.g. Alpha 10,000 having an operating temperature up to about 525° C.) or other means well known in the art.

The pressure sensor can be configured for use in a turbomachine oil filter, a turbomachine turbine section, a turbomachine compressor, or any devices or systems requiring high temperature pressure measurements.

In another aspect of this disclosure, a pressure sensor for a high temperature environment includes a MEMS pressure sensing transducer and a glass or glass-ceramic seal which can have a failure temperature above 599 degrees Celsius (e.g. about 600 degrees Celsius), or at least above the maximum operating temperature of sensor 101. Pressure transmitting fluid disposed in the fluid volume can have failure temperature above 314 degrees Celsius (e.g. 315 degrees Celsius) or at least substantially above the maximum operating temperature of sensor 314.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
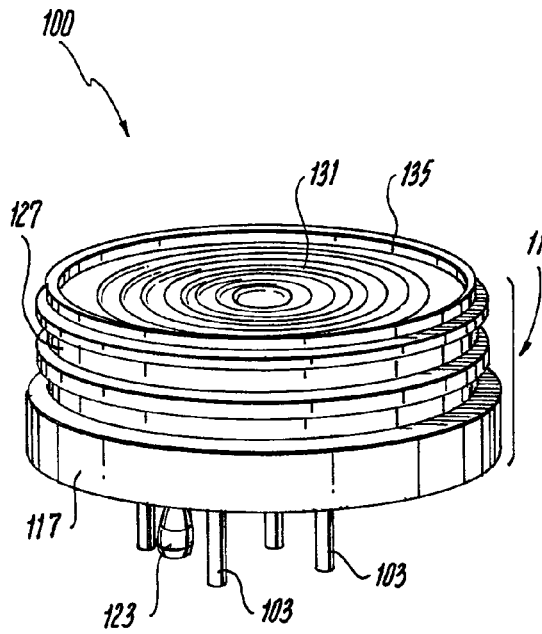
FIG. 1 is a perspective view of an embodiment of a pressure sensor constructed in accordance with the present disclosure, showing the pressure sensor assembled.
Figure 2:
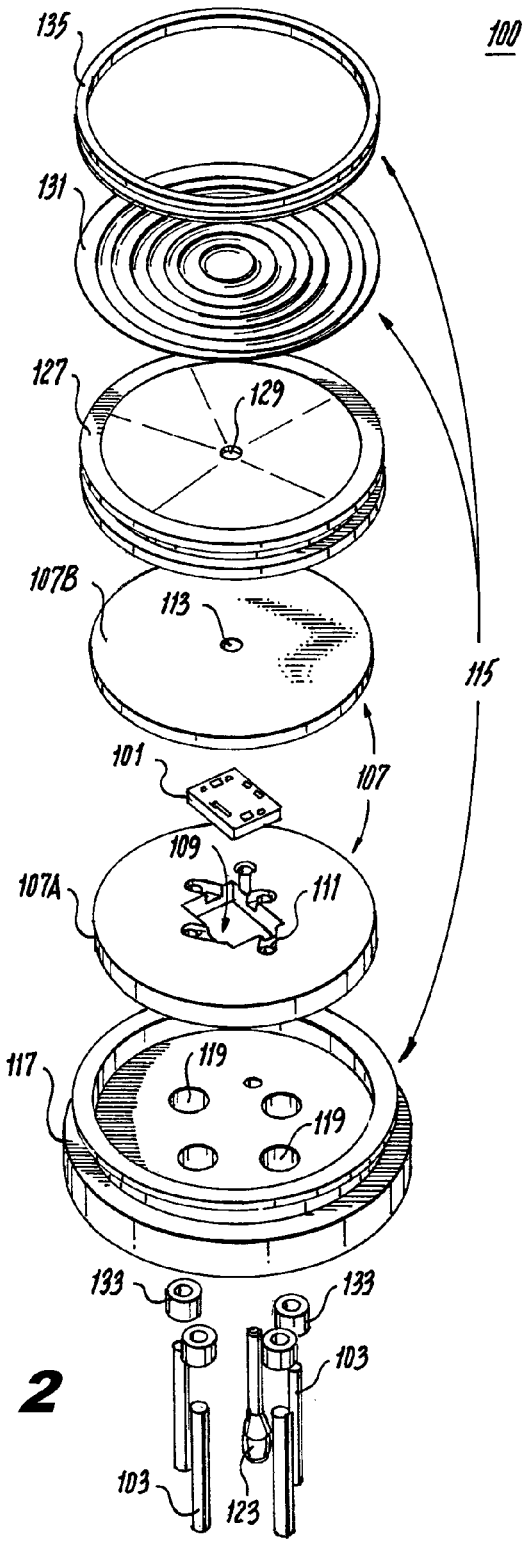
FIG. 2 is an exploded view of the pressure sensor of FIG. 1, showing each component of the pressure sensor.
Figure 3:
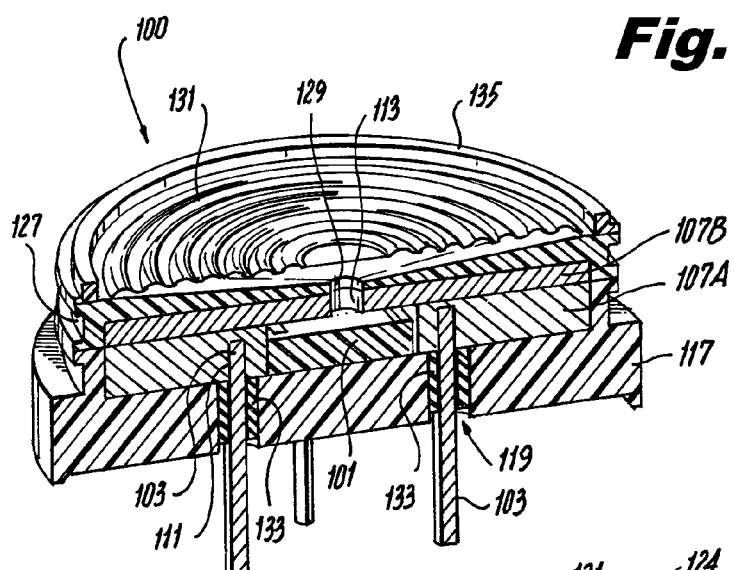
FIG. 3 is a cross-sectional perspective view of the pressure sensor of FIG. 1, showing the electrode pins passing into the inner casing.

Reference will now be made to the drawings wherein like reference numerals identify similar structural features or aspects of the subject disclosure. For purposes of explanation and illustration, and not limitation, an embodiment of a pressure sensor assembly in accordance with the disclosure is shown in FIGS. 1-5 and is designated generally by reference character 100. The systems and methods described herein can be used for sensing pressure in high temperature environments.

In at least one aspect of the present disclosure, the pressure sensor assembly 100 includes a pressure sensor 101 being placed in an inner case 107 and outer case 115 providing a volume for the sensor which is connected to a plurality of electrode pins 103 for transmitting an electrical signal. The pressure sensor 101 includes any suitable pressure transducer (not shown in detail) for converting pressure to an electrical signal. The pressure sensor 101 can be connected to the electrode pins 103 via a plurality of electrode pads 105 disposed on the pressure sensor 101. A wire can connect the pressure sensor 101 to the electrode pins 103 as shown in the Figs, directly through bonding of the wire to the electrode pads 105 and pins 103, and/or via any other suitable connection. The electrode pins 103 can have a diameter of about 0.010" up to about 0.040", or more specifically about 0.020". The diameter of the electrode pins 103 may be minimized to reduce the volume of the spaces surrounding the electrode pins 103. The electrode pins 103 can include gold, gold plating, a noble metal, a noble metal plating, and/or any other suitable metal and/or metal plating for wire bonding (e.g. Inconel 625).

The electrode pads 105 can include any metallization suitable for wire bonding but may include zirconium, nickel, and/or gold to prevent intermetallic compounds from forming at high temperatures, thereby enhancing reliability of the electrical connection of the wire and connection between electrode pads 105 at high temperatures. The pressure sensor further includes an inner casing 107 which is configured to hold the pressure sensor 101 in a sensor pocket 109 having a pocket volume larger than the sensor volume. The pocket volume can be minimized to be only slightly larger than the sensor volume in order to reduce total space inside the pressure sensor assembly 100. The pressure sensor 101 can be detached as described in U.S. Pat. No. 8,436,433 to Isebrand et al., the contents of which are hereby incorporated by reference in its entirety.

The inner casing 107 includes a plurality of inner casing electrode pin channels 111 having the electrode pins 103 disposed therein. Further, the inner casing electrode pin channels 111 are defined in a first inner casing side 107A. The channels 111 are larger than the electrode pins 103, but are of a size to minimize clearance to reduce internal volume as much as possible. A fluid port 113 is defined in a second inner casing side 107B. The inner casing 107 can include a high temperature plastic composition, any suitable high temperature insulating material, and/or any other material with a thermal expansion coefficient such it does not interfere with the pressure sensor 101 at extreme temperatures.

Figure 4:
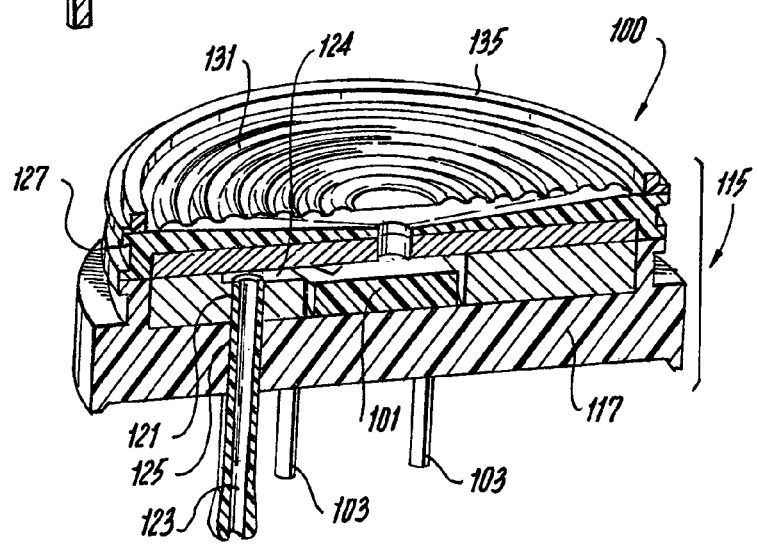
FIG. 4 is a cross-sectional view of the pressure sensor of FIG. 1, showing a fluid fill tube passing into the inner casing.
Figure 5:
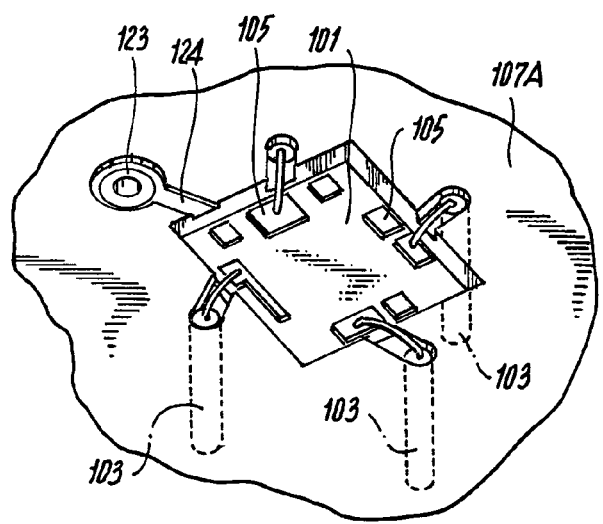
FIG. 5 is a partial, top down perspective view of the pressure sensor of FIG. 1, showing the pressure sensor disposed inside the inner casing.

As shown in FIGS. 4 and 5, inner casing 107 may also include an inner casing fluid fill tube channel 121 configured to have a fluid fill tube 123 disposed therein. The fluid fill tube 123 can also be in fluid communication with a fluid passage 124 that passes from the fluid fill tube 123 to the sensor pocket 109.

An outer casing 115 is configured to hold the inner casing 107 therein and includes a capsule header 117 having a plurality of capsule header electrode pin channels 119 defined therein. The capsule header 117 can receive the first inner casing side 107A. Also, the capsule header electrode pin channels 119 include a seal 133 disposed therein such that the capsule header electrode pin channels 119 engage the electrode pins 103 in a sealed relationship. The seal 133 can be disposed in the capsule header electrode pin channels 119 such that the seal 133 is flush with the back side of the first inner casing side 107A to reduce volume inside of the outer casing 115. Capsule header 117 may also be used to attach the pressure sensor assembly 100 to another device for sensing.

The seal 133 can include a high temperature ceramic, glass-ceramic, glass, refractory insulator, and/or any other suitable material that can have a failure temperature above about 599 degrees Celsius and/or above the intended maximum operating temperature of the pressure sensor assembly 100. In some embodiments, the seal 133 includes a glass-ceramic provided by TEKNA SEAL™ of 5301 East River Road, Minneapolis, Minn., which includes a failure temperature of about 600 degrees Celsius.

As shown in FIGS. 4 and 5, at least a portion of the outer casing 115 (e.g. capsule header 117) may also include an outer casing fluid fill tube channel 125 configured to have a fluid fill tube 123 disposed therein. The fluid fill tube 123 can be secured to the outer casing 115 or fluid fill tube channel 125 in any suitable manner, including, but not limited to welding, brazing, adhering, and/or combinations thereof.

In some embodiments, the fluid fill tube 123 can be sufficiently sealed after filling the sensor assembly 100 with fluid via any suitable means, including, but not limited to, a check valve disposed therein or at an end thereof, a pinch off, filling fluid fill tube 123 with sealant, a weld, and/or or any means that securely closes the fluid fill tube 123.

The outer casing 115 also includes an isolator plate 127 disposed over the second inner casing side 107B and in contact with the capsule header 117. The isolator plate 127 includes an isolator plate fluid port 129 defined therein. The isolator plate 127 can include a concave shape on a first side and a substantially flat shape on a second side.

The outer casing 115 further includes a pressure isolator 131 disposed on the isolator plate 127 and configured to deflect in response to a change in ambient pressure. Deflection errors can be a function of temperature, and in some embodiments, the pressure isolator 131 can be configured to have a neutral deflection or any temperature that is midway between the highest and lowest operating temperature and/or temperature for best performance of the sensor 101 over the operating range to reduce such error in a high temperature environment. In some embodiments, the neutral deflection is at about 75 degrees Celsius.

In some embodiments, the outer casing 115 can further include a isolator holder 135 that is disposed on the pressure isolator 131 and/or the isolator plate 127 to attached the pressure isolator 131 to the isolator plate 127 or any other portion of the outer casing 115.

The outer casing 117, and any components thereof, can include a high temperature metal and/or any other material with a thermal expansion coefficient such it does not interfere with the pressure sensor 101 at extreme temperatures.

A fluid volume is defined by a total remaining volume inside the inner casing 107 and the outer casing 115 combined, i.e. the space or void inside outer casing 115 not occupied by inner casing 107 or other solid components. In the some embodiments, the fluid volume can be about 0.0004 cubic inches, but can also be reduced to an absolute minimum volume.

In at least some embodiments, a pressure transmitting fluid which may be a petroleum oil and/or any other high temperature low vapor pressure fluid is disposed in the fluid volume to transmit pressure from the pressure isolator 131 to the pressure sensor 101. In some embodiments, the fluid can have a maximum operating temperature above 299 degrees Celsius (e.g. about 300 degrees C.) or a temperature that is higher than the intended operating temperature of the pressure sensor 101.

The herein disclosed pressure sensor assembly 100 has high temperature usability relative to conventional sensors. The herein described embodiment, pressure sensor assembly 100, and other embodiments, allow for a signal to be output from the sensor as a linear function of pressure at temperatures over 299 degrees Celsius (e.g. about 300 degrees Celsius), whereas conventional sensors fail to operate in linear fashion above about 125 degrees Celsius.

The methods and systems of the present disclosure, as described above and shown in the drawings, provide for a high temperature pressure sensor with superior properties including the ability to produce linear signals at high temperatures. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A pressure sensor assembly, comprising:
a pressure sensor having a pressure sensing transducer connected to a plurality of electrode pins for transmitting an electrical signal, the pressure sensing transducer being connected to the electrode pins via a plurality of electrode pads disposed on the pressure sensing transducer via a wire bond;
an inner casing configured to hold the pressure sensor in a sensor pocket having a pocket volume larger than the sensor volume, the inner casing further including a plurality of inner casing electrode pin channels having the electrode pins disposed therein, the inner casing electrode pin channels defined in a first inner casing side and a fluid port defined in a second inner casing side;
an outer casing holding the inner casing therein including:
a capsule header having a plurality of capsule header electrode pin channels defined therein, wherein the capsule header receives the first inner casing side, the capsule header electrode pin channels including a ceramic seal disposed therein such that the capsule header electrode pin channels engage the electrode pins in an insulating sealed relationship;
an isolator plate disposed over the second inner casing side and in contact with the capsule header, the isolator plate including an isolator plate fluid port defined therein; and
a pressure isolator disposed on the isolator plate and configured to deflect in response to a change in ambient pressure;
a fluid volume defined by a total remaining volume inside the inner casing and the outer casing combined; and
a pressure transmitting fluid disposed in the fluid volume.

2. The pressure sensor of claim 1, wherein the pressure sensor is a MEMS device.

3. The pressure sensor of claim 1, wherein the electrode pads include zirconium, nickel, and gold.

4. The pressure sensor of claim 1, wherein the pressure transmitting fluid has a high temperature of about 315 degrees Celsius.

5. The pressure sensor of claim 1, wherein the electrodes have a diameter of about 0.010" to about 0.040".

6. The pressure sensor of claim 1, wherein the fluid volume is about 0.0004 cubic inches.

7. The pressure sensor of claim 1, wherein the pressure isolator has a neutral deflection at mid-temperature between a high and low temperature of an operating temperature range.

8. The pressure sensor of claim 1, wherein the ceramic seal includes a ceramic glass having an upper failure temperature of about 600 degrees Celsius.

9. The pressure sensor of claim 1, wherein the pressure sensor is free floating inside the inner casing.

10. The pressure sensor of claim 1, wherein the pressure transmitting fluid includes petroleum oil.

11. The pressure sensor of claim 1, wherein the pressure sensor is configured for use in a turbomachine oil filter, a turbomachine turbine section, or a turbomachine compressor.

12. The pressure sensor of claim 1, wherein the inner casing includes a high temperature plastic.

13. The pressure sensor of claim 1, wherein the outer casing includes a high temperature metal.

14. The pressure sensor of claim 1, wherein the electrode pins include at least one of gold, gold plating, a noble metal, a noble metal plating, and any other suitable metal or metal plating for wire bonding.

15. A pressure sensor assembly for a high temperature environment, comprising:
a MEMS pressure sensor having a pressure sensing transducer connected to a plurality of electrode pins for transmitting an electrical signal, the pressure sensing transducer being connected to the electrode pins via a plurality of electrode pads disposed on the pressure sensing transducer via a wire bond, the electrode pads including a zirconium-nickel-gold composition;
an inner casing configured to hold the pressure sensor in a sensor pocket having a pocket volume larger than the sensor volume, the inner casing further including a plurality of inner casing electrode pin channels having the electrode pins disposed therein, the inner casing electrode pin channels defined in a first inner casing side and a fluid port defined in a second inner casing side;
an outer casing holding the inner casing therein including:
a capsule header having a plurality of capsule header electrode pin channels defined therein, wherein the capsule header receives the first inner casing side, the capsule header electrode pin channels including a glass-ceramic seal disposed therein such that the capsule header electrode pin channels engage the electrode pins in an insulating sealed relationship, wherein the glass seal has a failure temperature above 599 degrees Celsius;
an isolator plate disposed over the second inner casing side and in contact with the capsule header, the isolator plate including an isolator plate fluid port defined therein; and
a pressure isolator disposed on the isolator plate and configured to deflect in response to a change in ambient pressure;

a fluid volume defined by a total remaining space inside the inner casing and the outer casing combined; and a pressure transmitting fluid disposed in the fluid volume having a failure temperature above 314 degrees Celsius, the pressure transmitting fluid including a petroleum oil.

* * * * *